(12) United States Patent
Beery et al.

(10) Patent No.: US 9,059,400 B2
(45) Date of Patent: Jun. 16, 2015

(54) MAGNETIC RANDOM ACCESS MEMORY CELLS WITH ISOLATING LINERS

(71) Applicant: Crocus Technology Inc., Santa Clara, CA (US)

(72) Inventors: Dafna Beery, Palo Alto, CA (US); Jason Reid, San Jose, CA (US); Jong Shin, San Jose, CA (US); Jean Pierre Nozieres, Le Sappey-en-Chartreuse (FR); Olivier Joubert, Grenoble (FR)

(73) Assignee: Crocus Technology Inc., Santa Clara, CA (US)

( * ) Notice: Subject to any disclaimer, the term of this patent is extended or adjusted under 35 U.S.C. 154(b) by 0 days.

(21) Appl. No.: 14/203,362

(22) Filed: Mar. 10, 2014

(65) Prior Publication Data

US 2014/0252516 A1    Sep. 11, 2014

Related U.S. Application Data

(60) Provisional application No. 61/776,739, filed on Mar. 11, 2013.

(51) Int. Cl.
*H01L 27/00* (2006.01)
*H01L 43/12* (2006.01)
*H01L 27/22* (2006.01)
*H01L 43/08* (2006.01)

(52) U.S. Cl.
CPC .............. *H01L 43/12* (2013.01); *H01L 27/222* (2013.01); *H01L 43/08* (2013.01)

(58) Field of Classification Search
CPC ..................................................... H01L 27/222
See application file for complete search history.

(56) References Cited

U.S. PATENT DOCUMENTS

| | | | |
|---|---|---|---|
| 6,413,788 B1 * | 7/2002 | Tuttle | 438/3 |
| 6,783,999 B1 | 8/2004 | Lee | |
| 2003/0199104 A1 | 10/2003 | Leuschner et al. | |
| 2005/0051820 A1 * | 3/2005 | Stojakovic et al. | 257/295 |
| 2005/0274997 A1 | 12/2005 | Gaidis et al. | |
| 2008/0054385 A1 | 3/2008 | Klostermann | |
| 2008/0105862 A1 | 5/2008 | Lung et al. | |
| 2010/0177557 A1 | 7/2010 | Liu et al. | |
| 2012/0108434 A1 | 5/2012 | Bulzacchelli et al. | |
| 2012/0146166 A1 * | 6/2012 | Levi et al. | 257/421 |
| 2014/0284672 A1 * | 9/2014 | Juengling | 257/296 |

OTHER PUBLICATIONS

International Search Report and Written Opinion issued to International Patent Application No. PCT/US2014/022677, Aug. 4, 2014, 7 pgs.

* cited by examiner

*Primary Examiner* — Ngan Ngo
(74) *Attorney, Agent, or Firm* — Cooley LLP

(57) ABSTRACT

A manufacturing method to form a memory device includes forming a hard mask on a magnetic stack. A first magnetic stack etch is performed to form exposed magnetic layers. A liner is applied to the exposed magnetic layers to form protected magnetic layers. A second magnetic stack etch forms a magnetic random access memory (MRAM) cell, where the liner prevents shunting between the protected magnetic layers.

7 Claims, 3 Drawing Sheets

MAGNETIC RANDOM ACCESS MEMORY CELLS WITH ISOLATING LINERS

CROSS-REFERENCE TO RELATED APPLICATION

This application claims priority to U.S. Provisional Patent Application Ser. No. 61/776,739, filed Mar. 11, 2013, the contents of which are incorporated herein.

FIELD OF THE INVENTION

The invention relates generally to memory devices. More particularly, the invention relates to memory devices including magnetic random access memory ("MRAM") cells with isolating liners to prevent shunting.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each one of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value Rmax corresponding to a high logic state "1". On the other hand, when the respective magnetizations are parallel, the resistance of the magnetic tunnel junction is low, namely having a resistance value Rmin corresponding to a low logic state "0". A logic state of a MRAM cell is read by comparing its resistance value to a reference resistance value Rref, which is derived from a reference cell or a group of reference cells and represents an in-between resistance value between that of the high logic state "1" and the low logic state "0".

A MRAM device is conventionally manufactured by photolithography, in which a photoresist is used as a soft mask for patterning a stack of magnetic layers. Specifically, a photoresist layer is formed on the stack of magnetic layers, and the photoresist layer is then patterned to form an array of dots. Portions of the stack of magnetic layers exposed by the array of dots are then etched away to form a corresponding array of MRAM cells. Subsequently, the photoresist layer is stripped to result in a MRAM device.

The above-described manufacturing method can suffer from certain deficiencies. One such deficiency is that during a magnetic stack etch sputtered material may accumulate on the previously etched magnetic stack. The sputtered material may subsequently cause shunting of magnetic layers across a tunnel barrier layer.

It is against this background that a need arose to develop the memory devices and related manufacturing methods described herein.

SUMMARY

A manufacturing method to form a memory device includes forming a hard mask on a magnetic stack. A first magnetic stack etch is performed to form exposed magnetic layers. A liner is applied to the exposed magnetic layers to form protected magnetic layers. A second magnetic stack etch forms a magnetic random access memory (MRAM) cell, where the liner prevents shunting between the protected magnetic layers.

A memory device includes an MRAM cell comprising a magnetic stack with exposed magnetic layers and a liner preventing shunting between protected magnetic layers.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

Figure 1:
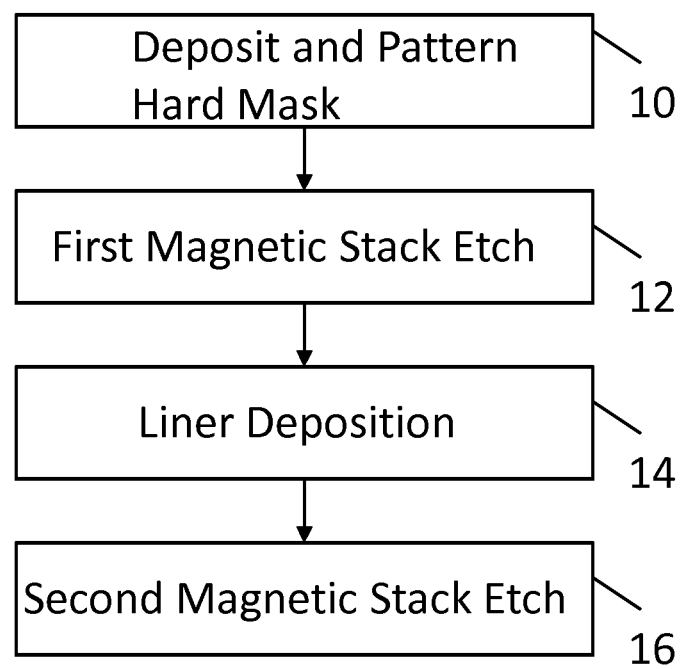
FIG. 1 illustrates processing operations associated with an embodiment of the invention.
Figure 2:
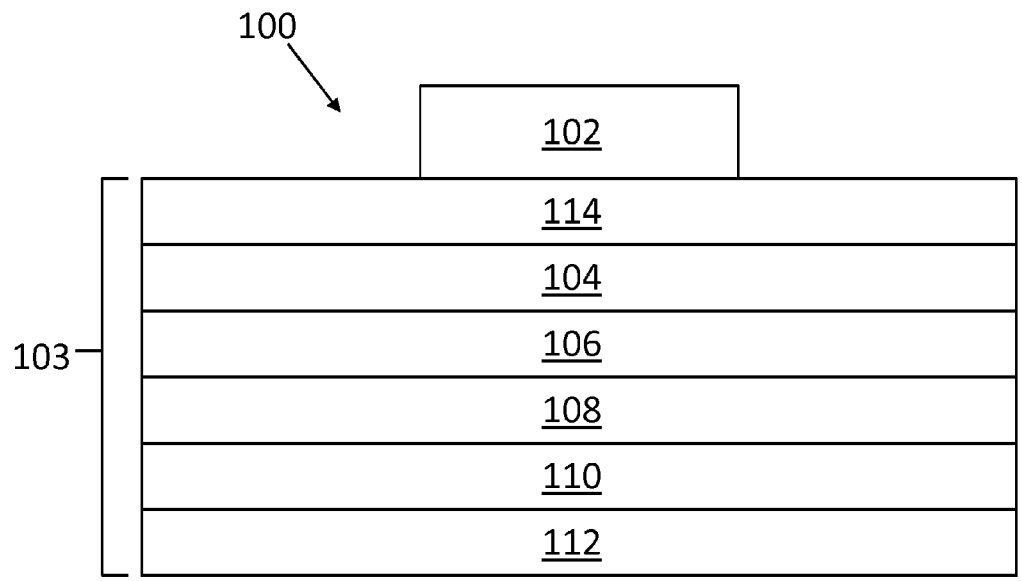
FIG. 2 illustrates an MRAM cell with a hard mask on a set of magnetic layers.

FIG. 1 illustrates processing operations associated with an embodiment of the invention. Initially, a hard mask is deposited and patterned on a set of magnetic layers 10. FIG. 2 illustrates an MRAM cell 100 with a hard mask 102 deposited and etched on a set of magnetic layers 103. The hard mask material may be metallic or dielectric. Photoresist used to form the hard mask 102 has been removed and therefore FIG. 2 only illustrates the remaining hard mask 102.

The MRAM cell 100 is implemented as a magnetic tunnel junction, and includes a storage layer 106, a reference layer 110, and an insulating layer 108 that is disposed between the storage layer 106 and the reference layer 110. Each of the storage layer 106 and the reference layer 110 includes, or is formed of, a magnetic material and, in particular, a magnetic material of the ferromagnetic type. In general, the storage layer 106 and the reference layer 110 can include the same ferromagnetic material or different ferromagnetic materials. Examples of suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. A thickness of each of the storage layer 106 and the reference layer 110 can be in the nanometer ("nm") range, such as from about 1 nm to about 20 nm or from about 1 nm to about 10 nm.

The insulating layer 108 functions as a tunnel barrier, and includes, or is formed of, an insulating material. Examples of suitable insulating materials include oxides, such as aluminum oxide (e.g., Al2O3) and magnesium oxide (e.g., MgO). A thickness of the insulating layer 108 can be in the nm range, such as from about 1 nm to about 10 nm.

The MRAM cell 100 also includes a pinning layer 112, which is adjacent to the reference layer 110 and, through exchange bias, stabilizes a magnetization of the reference layer 110 along a particular direction when a temperature within, or in the vicinity of, the pinning layer 112 is lower than a blocking temperature TBR, or another threshold temperature such as a Neel temperature. In the illustrated embodiment, the MRAM cell 100 is implemented for thermally assisted switching ("TAS"), and the storage layer 106 is also exchange biased by another pinning layer 104, which is adjacent to the storage layer 106 and is characterized by a blocking temperature TBS, or another threshold temperature, which is smaller than the blocking temperature TBR. Below the blocking temperature TBS, a magnetization of the storage layer 106 is stabilized by the exchange bias, thereby retaining a stored logic state in accordance with a direction of that magnetization. Writing is carried out by heating the MRAM cell 100 above the blocking temperature TBS (but below TBR), thereby unpinning the magnetization of the storage layer 106 to allow writing, such as by applying a magnetic field. The MRAM cell 100 is then cooled to below the blocking temperature TBS with the magnetic field applied, such that the magnetization of the storage layer 106 is retained in its written direction. The techniques of the invention are equally applicable to non-TAS architectures, namely any MRAM cell.

Each of the pinning layers 104 and 112 includes, or is formed of, a magnetic material and, in particular, a magnetic material of the antiferromagnetic type. Examples of suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For certain implementations, the pinning layer 104 can include an alloy based on Ir and Mn (or based on Fe and Mn) with a blocking temperature TBS in the range of about 120° C. to about 220° C. or about 150° C. to about 200° C., and the pinning layer 112 can include an alloy based on Pt and Mn (or based on Ni and Mn) with a blocking temperature TBR in the range of about 300° C. to about 350° C.

The MRAM cell 100 further includes a cap layer 114, which is adjacent to the pinning layer 104 and forms an upper portion of the MRAM cell 100. The cap layer 114 provides electrical connectivity, as well as either, or both, thermal insulation and a protective function for underlying layers during manufacturing of the MRAM cell 100, and includes, or is formed of, an electrically conductive material. Examples of suitable electrically conductive materials include metals, such as copper, aluminum, Tantalum, Tantalum Nitride and platinum; and alloys. A thickness of the cap layer 114 can be in the nm range, such as from about 1 nm to about 100 nm.

For ease of presentation and to motivate certain advantages and functionalities a single MRAM cell 100 is illustrated, although it is contemplated that multiple MRAM cells can be included, such as in the form of an array. It should also be appreciated that the individual layers are not drawn to scale.

Other implementations of the MRAM cell 100 are contemplated. For example, the relative positioning of the storage layer 106 and the reference layer 110 can be reversed, with the reference layer 110 disposed above the storage layer 106. As another example, either, or both, of the storage layer 106 and the reference layer 110 can include multiple sub-layers in a fashion similar to that of the so-called synthetic antiferromagnetic layer. As further examples, either, or both, of the pinning layers 104 and 112 can be omitted, and the cap layer 114 also can be omitted.

Figure 3:
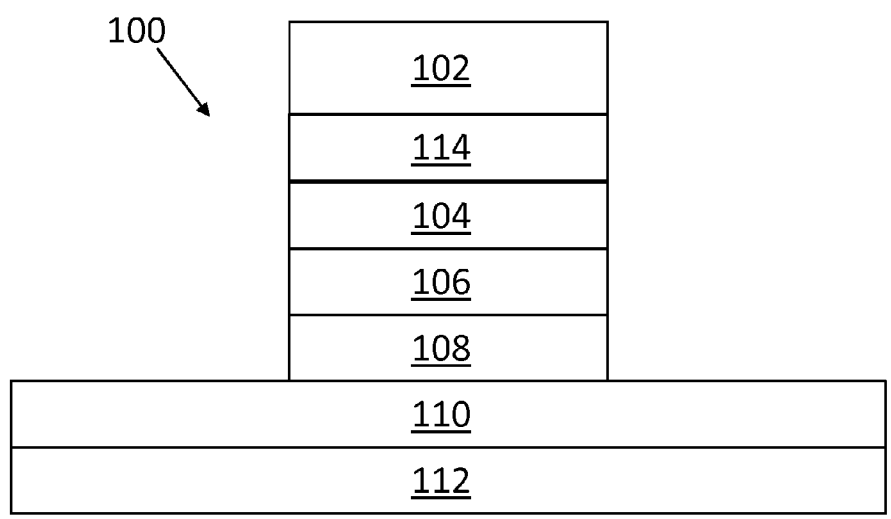
FIG. 3 illustrates the results of a first magnetic stack etch performed in accordance with an embodiment of the invention.

Returning to FIG. 1, the next operation is to perform a first magnetic stack etch 12. FIG. 3 illustrates the result of such etch. In this example, the first magnetic stack etch is stopped immediately after the tunnel layer 108 to form exposed magnetic layers 104, 106 and 108. The etch may be a physical etch (e.g., using an Ion Beam Etching tool) or a reactive etch (e.g., using a Reactive Ion Etching tool) or a combination of both techniques. The etch stop may be based on end point detection, time or both. The etch stop may be at any magnetic layer.

Figure 4:
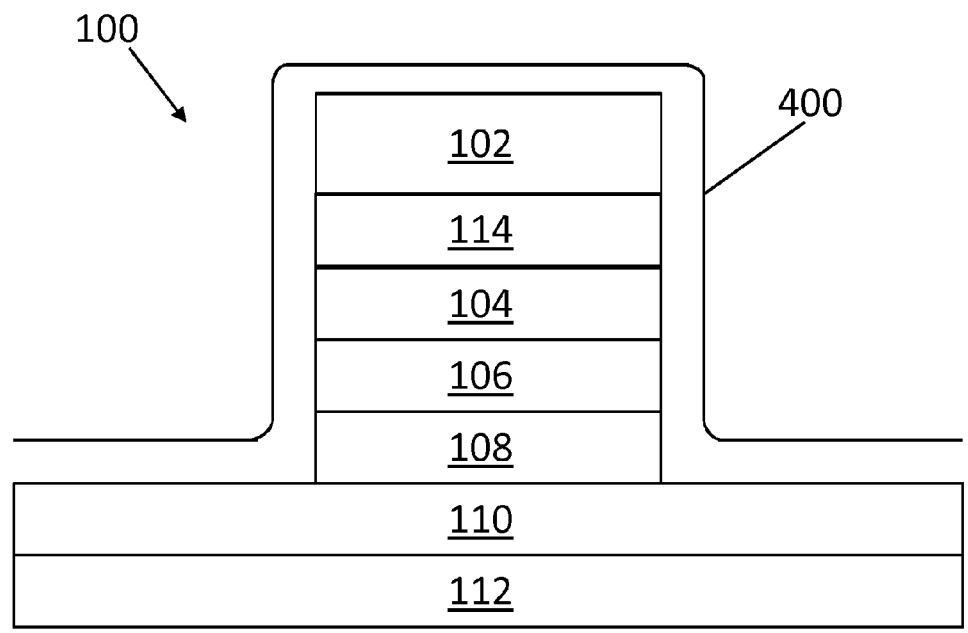
FIG. 4 illustrates isolating liner deposition performed in accordance with an embodiment of the invention.

The next operation of FIG. 1 is isolating liner deposition 14. FIG. 4 illustrates a deposited isolating liner 400. The isolating liner 400 protects magnetic layers 104, 106 and 108. By way of example, the isolating liner 400 may be a thin layer of dielectric materials, such as SiN or Oxide. The isolating liner 400 may be deposited or spun on the device. The thickness of the isolating liner may be tens to hundreds of Angstroms. In this example, observe that the liner 400 protects the layers 104, 106 and 108 and covers the unetched layer 110. The isolating liner may be configured to protect any combination of magnetic layers.

The final operation of FIG. 1 is to perform a second magnetic stack etch 16. The second magnetic stack etch may be a physical etch, a reactive etch or a combination thereof.

Figure 5:
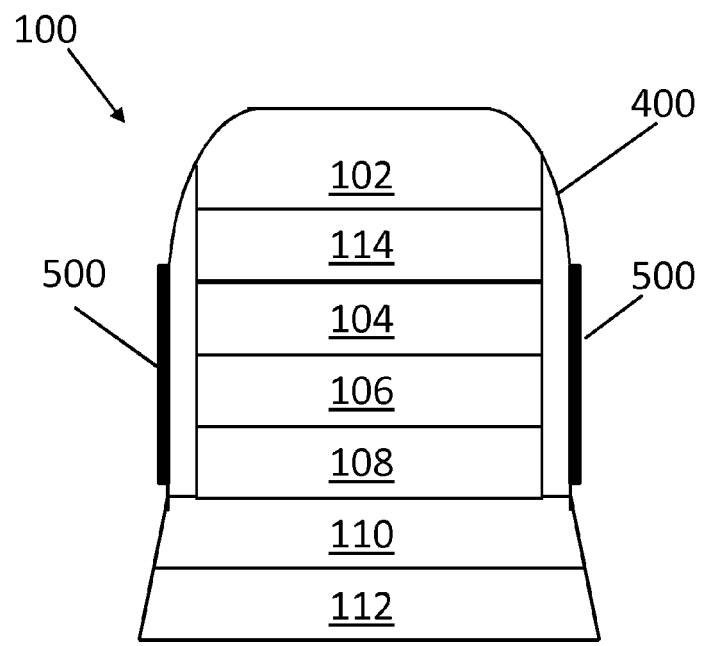
FIG. 5 illustrates the results of a second magnetic stack etch performed in accordance with an embodiment of the invention.

FIG. 5 illustrates the results of this operation. In particular, the figure illustrates the etching of the reference layer 110 and the pinning layer 112, which are now exposed magnetic layers. The isolating liner 400 remains on the sidewalls of the stack. Sputtered material 500 from the second magnetic stack etch accumulates on the deposited dielectric liner 400. However, the liner prevents shunting of magnetic layers across the tunnel barrier layer 108. The liner 400 also protects the already etched layers from chemical attack and damage due to continuous exposure to reactive gases and/or physical erosion.

It should be appreciated that liner application is not restricted to a single deposition during a magnetic etch process. Liner application may be repeated. For example, an etch can be stopped when reaching a chosen specific layer above or below the tunnel layer 108 and liner can be applied.

The liner may be applied using a spin-on technique or a deposition technique, such as chemical vapor deposition or plasma vapor deposition. In some embodiments, the liner is deposited as a thick layer (e.g., greater than 1000 Angstroms) and is then etched back using a dry, wet or combined etch.

It should be appreciated that the technique of the invention is applicable to magnetic cells of various shapes (e.g., round, elliptical and the like). In one embodiment, the liner is applied after removal of remaining photoresist and polymeric residues formed during an etch process.

Observe that the liner does not prevent etching of the magnetic stack below the liner. Further observe that the liner does not erode completely during the second magnetic stack etch. The liner may be applied at temperatures appropriate for processing magnetic stack wafers. Advantageously, the liner does not cause stack damage or delamination due to high stress. Rather, the liner forms a continuous layer around protected magnetic layers, including a tunnel barrier layer.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

The invention claimed is:

1. A manufacturing method to form a memory device, comprising:
    forming a hard mask on a magnetic stack;
    performing a first magnetic stack etch to form exposed magnetic layers;
    applying a liner to the exposed magnetic layers to form protected magnetic layers; and
    performing a second magnetic stack etch to form a magnetic random access memory (MRAM) cell, wherein the liner prevents shunting between the protected magnetic layers.

2. The manufacturing method of claim 1 wherein the first magnetic stack etch stops immediately after a tunnel barrier layer.

3. The manufacturing method of claim 1 wherein the first magnetic stack etch and the second magnetic stack etch are selected from a physical etch and a reactive etch.

4. The manufacturing method of claim 1 wherein the liner is applied by a technique selected from spinning and deposition.

5. The manufacturing method of claim 1 wherein the liner is between 10 and 100s of Angstroms.

6. The manufacturing method of claim 1 further comprising repeating the applying operation before a subsequent magnetic stack etch.

7. The manufacturing method of claim 1 wherein applying includes applying the liner and then etching the liner.

* * * * *